United States Patent [19]

Casowitz et al.

[11] 4,100,486
[45] Jul. 11, 1978

[54] MONITOR FOR SEMICONDUCTOR DIFFUSION OPERATIONS

[75] Inventors: Barry N. Casowitz, Poughkeepsie; Michael D. Cowan, Wappingers Falls, both of N.Y.; Charles B. Humphreys, Essex Junction, Vt.; Akella V. S. Satya, Wappingers Falls, N.Y.

[73] Assignee: International Business Machines Corporation, Armonk, N.Y.

[21] Appl. No.: 776,691

[22] Filed: Mar. 11, 1977

[51] Int. Cl.² .......................................... G01R 27/02
[52] U.S. Cl. .................................... 324/62; 324/51;
324/158 R; 29/574; 324/64
[58] Field of Search ............... 324/62, 64, 51, 158 R, 324/158 D; 29/574, 577

[56] References Cited

U.S. PATENT DOCUMENTS

| 3,304,594 | 2/1967 | Madland | 29/577 |
|---|---|---|---|
| 3,487,301 | 12/1969 | Gardner et al. | 324/64 |
| 4,024,561 | 5/1977 | Ghatalia | 324/64 X |

OTHER PUBLICATIONS

Benjamin, Semiconductor Resistance Measuring Technique, IBM Technical Disclosure Bulletin, Jun. 1, 1967, p. 97.

Hubacher et al., Detecting Defects in Integrated Semiconductor Circuits, IBM Technical Disclosure Bulletin, Feb. 1972, pp. 2615-2617.

Stelmak, Defects Detection in a Metal-Oxide-Silicon Structure, IBM Technical Disclosure Bulletin, Jun. 1972, pp. 177, 178.

Primary Examiner—Stanley T. Krawczewicz
Attorney, Agent, or Firm—Henry Powers

[57] ABSTRACT

An electrical defect density monitor for semiconductor device fabrication utilizing a silicide of a formed transitional metal (such as platinum silicide) on a surface of a silicon substrate as a resistor in parallel with the resistance of the underlying substrate, including diffused regions, to improve measurement sensitivity of high sheet resistivity areas. The measurement can be employed for measuring the integrity of diffused regions and/or of dielectric coatings.

18 Claims, 7 Drawing Figures

MONITOR FOR SEMICONDUCTOR DIFFUSION OPERATIONS

FIELD OF THE INVENTION

This invention relates to the measurement of electrical resistivities of semiconductor substrates and, more particularly, to a resistivity test for monitoring diffusion operations in the fabrication of semiconductor devices.

DESCRIPTION OF THE PRIOR ART

The fabrication of integrated circuits is an extremely complex process that may involve several hundred or more individual operations. Among the basic operations involved are diffusions of predetermined minute quantities of impurities, such as phosphorous, boron, arsenic, and the like, into precisely predetermined areas of a semiconductor substrate, such as a silicon wafer. These diffusion operations are repeated at a plurality of stages in the fabrication of complex integrated devices.

Such diffusion operations normally involve the formation of an insulating or dielectric layer (conventionally of silicon dioxide, quartz, and the like) on the substrate or wafer, followed by coating thereof with a photosensitive resist for ultimate masking of the dielectric layer in a pattern defining openings or windows to be formed therein in the areas in which impurities are to be diffused in the substrate. This can be accomplished by exposure of the resist through a photomask carrying a pattern image corresponding to the desired openings or diffusion windows in the glass. After exposure, either the exposed or unexposed areas of the resist (depending on its type) can be removed by conventional developing techniques. With negative resists (such as Kodak's KPR), exposed areas are formed into fixed areas resistant to removal in development, which only removes the unexposed areas to leave an etch resistant pattern complementary to the desired diffusion windows to be formed in the dielectric diffusion mask on the semiconductor substrate. Conversely, with positive resists (such as the Azoplate AZ series, e.g. AZ-1350), the exposed areas are amenable to removal in development so as to retain the unexposed areas in a pattern corresponding to the desired diffusion windows.

On development of the resist, openings are then etched through the silicon dioxide layer to define the desired pattern of very small areas into which diffusion takes place. After a number of such diffusion operations have been carried out to produce desired transistors (e.g. bi-polar and/or field effect), diodes, resistors, and the like, in a wafer, conductor interconnection lines are then formed, also by photolithographic techniques, to interconnect the circuit elements. A typical integrated circuit may have from hundreds to thousands of minute diffused areas contained within a chip measuring only 0.1 inch by 0.1 inch. The complexity of the circuitry can be seen on consideration that some diffused areas may be as small as 0.00008 by 0.00008 inch (e.g. 2 × 2 microns) with spacing between diffused areas of the order of 0.0001 inch (2.5 microns).

Accordingly, integrated circuit manufacturing processes must be carried out with the utmost precision. For reliable operation and increased yield, the electrical characteristics of the circuits must be kept within carefully controlled limits, which necessitates a high degree of process control over diffusions, photoresist application, exposure and development, etching and similar processes.

However, one of the serious problems encountered in the operations, particularly in photoresist and photomask operations, may result from the presence of dust, skin flakes, minute scratches, and other imperfections on the photomask and/or on the resist, which may produce defective patterns on the semiconductor wafers. For example, small dust particles on the transparent areas of a photomask may prevent exposure of resist in the desired areas of the resist, which in negative resists results in the undesired removal of areas in the resist, forming diffusion defects in the substrate, and conversely, in positive resists results in the retention of the resist, on development, which prevents ultimate diffusion in the desired areas, hereinafter referred to as blank defects. Similarly, the presence of pin holes or light transmitting sites in the opaque areas of a photomask can result in undesired exposure of the corresponding portions of the resist which, with negative resists, prevents the removal, on development, to result in blank defects; and conversely, with positive resists, undesired removal of the resist will result. The presence of diffusion defects in the intermediate portions between diffused regions can result in shorts therebetween, or at the minimum, a distortion of the electrical characteristics of the integrated circuit. Similarly, the presence of blank defects in any portion of the desired diffused regions can result, either in opens or at best, a distortion of the electrical characteristics of the integrated circuits.

Heretofore, one of the methods for determining the integrity of diffused regions was by measurement of the sheet resistance of the diffused regions, as for example, described in U.S. Pat. Nos. 3,304,594 and 3,676,229. However, in high densified integrated devices, probing of the diffused regions (assuming access thereto) is rendered difficult, if not impossible, in view of the minuteness of some of these regions, e.g. 0.00008 inch, (2 microns). Also, in the case of simpler devices, the high sheet resistance of the diffused regions, which can range from several hundred to several thousand ohms per square, which for extended lines, e.g. 3,000 squares results in an extremely high total resistance, as for example 0.3 to 3.0 megohms. Such high resistances are too large for accurate measurement by any known method since any readings would be blanketed by junction leakages.

SUMMARY OF THE INVENTION

In its broad aspect, the invention herein comprehends the conversion of a surface adjacent portion of a silicon semiconductor structure into a silicide of a transitional metal selected from Group VIII of the Periodic Table, with measurement of the electrical resistance of the silicide at spaced points thereon for determination of the sheet resistance of the semiconductor. In such structures, the silicide forms a resistor in parallel with the resistance of the coextending semiconductor body whose resistance can be found in accordance with conventional parallel resistance theory where the resistance of one is known. Since the resistance of the silicide is a constant (e.g. 1 ohm/sq. for platinum silicide), the voltage drop across it can be utilized for determining the parallel resistance of the associated semiconductor body.

Similarly, the invention can be employed in measuring diffused areas by lowering the diffusion-resistance without introducing new interfering defects.

In practice, a semiconductor structure is blanketed with a layer of a transition metal (in Group VIII of the Periodic Table), sintered for reaction with the silicon to form the corresponding metal silicide (e.g. platinum silicide), dip etched in known etchants, such as hot aqua regia solution to remove unreacted metal with the retained silicide ready for probing and data analysis.

In application to measurement of diffused regions employing masks, non-reactive with the transition metal, such as silicon dioxide, quartz, silicon nitride, and the like, the mask is retained, and the transition metal is blanket-evaporated over the mask and the open diffused region. Since the transition metal is unreactive on sintering with the mask, it is removed, as unreacted metal, on dip-etching, leaving a silicide only in the diffused region for probing.

The resistance of the silicide can be readily controlled by appropriate selection of processing parameters. In application, the transitional metal can be blanketed on the silicon structure in coating thicknesses of the order of about 300 Å (e.g. 0.03 microns) to about 0.1 microns in accordance with anticipated silicide layer to be formed from the silicon structure, which conversely will determine the resultant sheet resistance. The ultimate silicide layer of the silicide is also dependent on the duration and temperature of the sintering operation in accordance with classical theory. Typically, a 0.05 micron coating of platinum on silicon will form a 0.08 micron layer of platinum silicide when sintered at 550° C for 30 minutes, with the resultant platinum silicide having a sheet resistance of about 1.0 ohm/per square. This is a substantial reduction in the sheet resistance of the parallel silicon body to enable more accurate measurement thereof by conventional probing and measurement of voltage drop across the parallel resistances of the silicide and the silicon.

With the sheet resistance $R_{MS}$ of the metal silicide establishing the parallel sheet resistance $R_{Si}$ of the silicon body, the total resultant resistance $R_T$ can be determined from the following relationship:

$$1/R_T = (1/R_{MS}) + (1/R_{Si})$$

with $R_T$ much less than $R_{Si}$, which is now measurable over long lengths of the diffusion.

The invention has application in monitoring the integrity of diffusion masks and diffusion operations at any level employed in the fabrication of integrated circuits. As indicated, defects in the photomask and in the photoresist can cause various defects in the photoresist employed which in turn, translate in corresponding defects in the resultant insulator (e.g. $SiO_2$) diffusion mask retained on the surface of a silicon substrate. The specific defects formed in either positive and negative resists during exposure as a result of defects in the photomask and its effects on diffusion masks have been discussed above and are applicable here. Briefly, failure to photolithographically remove unwanted resist in the desired open areas (e.g. for etching of an insulator coating into a diffusion mask) will result in its retention with corresponding retention of portions of the insulator layer in diffusion windows of a diffusion mask, which result in opens or modification of the electrical properties in the formation of diffused regions.

Conversely, photolithographic removal of resists in desired imperforate areas of the etchant mask will result, on etching, in the removal of underlying portions of the diffusion mask, which convert in undesired diffused areas which can short adjacent designed diffused regions and/or modify the electrical properties of the ultimate device.

For determining the integrity of diffused regions in silicon devices, a plurality of closely spaced elongated diffused regions can be formed in test sites of a wafer, which can comprise chip or kerf portions of the wafer. These diffused test regions can either comprise a plurality of closely spaced coextending parallel test regions or closely packed serpentine patterns, each of which will normally be characterized with a diffusion width of the order of 2 microns, with spacings of 3 microns between parallel runs of the test diffusions. Where the test diffusion lines comprise a plurality of individual parallel coextending runs, terminal ends thereof may be tied to test points for probing to obtain resistance readings for analysis of the number of defects, as well as their sizes and sites. The total length of such lines may comprise a total length of 3 inches (eg. 7.5 mm. or 7,500 microns) with each line of about 0.75 inches (or 19 mm.) length, contained in a test site area of the order of 0.06 inch by 0.08 inch (eg. 1.5 × 2mm). Conversely, where the test lines comprise parallel legs of a closely packed serpentine run, the terminal portions may be probed at appropriate test sites for the resistance readings. The unfolded extension of such a serpentine pattern may be of the order of 2 inches (51 mm) formed in a test site area of 0.0018 sq. inches (eg. 1.16 sq. mm.). Also, by varying the width of the diffused test runs, the defect size distribution can be determined by counting the electrical failures corresponding to the various test run widths.

After diffusion, the diffusion mask (e.g. $SiO_2$) will be retained in the test areas on blanketing of the test areas with a coating of a transitional metal (e.g. platinum). The structure is then sintered to form a silicide between the metal and the silicon in the open test diffused regions. Since the transition metal is non-reactive with the diffusion mask (e.g. $SiO_2$), the metal is removed by dipetching the structure in a solution of hot aqua regia as well as any excess metal over the diffused regions, so as to retain the formed silicide in the diffused regions. The final structure is then available for resistance measurements at spaced points on the silicide. As will be understood where the test diffusion runs are formed concurrently with design diffusion of an integrated circuit, the processing may include reoxidation for protection of these design diffusions, and photolithographic delineation of appropriate openings over the test diffused runs to provide access for suitable probing for resistance measurements.

Also, the invention is applicable for monitoring any level of diffusion, which can be conveniently obtained by providing a test site for each diffusion level for corresponding formation of the silicide for each diffusion operation.

Accordingly, it is an object of this invention to provide a novel method for measuring electrical properties of semiconductors.

Another object of this invention is to provide a simplified and accurate method for measuring the resistivity of semiconductor substrates.

A further object of this invention is to provide a simplified and accurate means for determination of opens and shorts in and between diffused regions of a semiconductor device.

A still further object of this invention is to provide a novel and accurate resistivity test for determining the integrity of masking operations in the fabrication of semiconductor devices.

It is also an object of this invention to provide a novel and accurate integrated test pattern in a semiconductor wafer as a means for determining reliability assurance of functional integrated circuits.

A further object of this invention is to achieve a quantitative measure of and separation between junction related defects and photo-related defects employing the use of the parallel resistor concept.

The foregoing and other objects, features and advantages of the invention will be apparent from the following more particular description of the invention as illustrated in the accompanying drawings.

BRIEF DESCRIPTION OF THE DRAWINGS

FIGS. 2AA and 2AB are schematic drawings in perspective illustrating defects in the structure of FIG. 2A which are to be sensed by resistivity measurements in accordance with this invention.

DESCRIPTION OF PREFERRED EMBODIMENTS

Various methods for the fabrication of integrated circuits are well known, and can be employed in fabrication of devices to which this invention is directed. Accordingly, the following description of the embodiments of this invention will be limited to that portion of fabrication relating to the invention itself.

Also, the causes and effects of defects in photomasks, contamination, blemishes, dust, and the like, on such masks and on photoresist employed, which although they have been discussed above, are also well known, as well as their effect on diffusion operations. More extended discussions of this matter and proposed solutions can be found in various sources, including U.S. Pat. Nos. 3,476,561, 3,518,084, 3,673,018 and 3,751,648. To the extent that the subject matter is required to supplement comprehension of the invention described herein, the contents of such patents are incorporated herein by reference thereto.

Figure 1A:
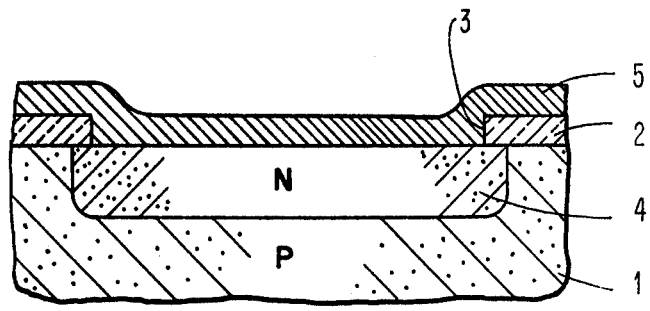
FIGS. 1A to 1C are exaggerated schematic drawings, in cross-section, showing three stages in the fabrication of a structure for purposes of illustrating the broad concept of the invention.
Figure 1B:
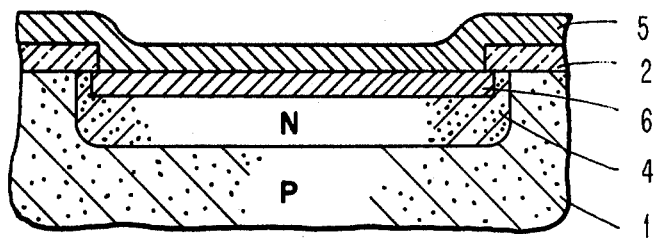
Figure 1C:
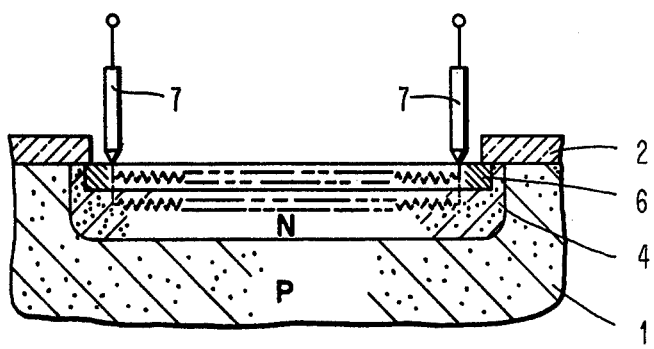

FIG. 1A is an elevational view illustrating the broad concept of this invention showing a processing step as to a semiconductor device following a conventional diffusion operation.

As indicated previously, the invention will be incorporated in a test site concurrently with the fabrication of integrated circuits formed in a plurality of chip areas separated by kerf regions in a semiconductor substrate known as a wafer. As shown, the basic structure comprises a p-type silicon substrate 1, with it to be understood, can also comprise a p-type epitaxial layer grown on an n-type sub-base. In any event, such a substrate is normally oxidized in the initial operations to form a dense film 2 of silicon oxide at least over the exposed functional surface of the substrate in which devices are to be formed. As is known, the film can comprise a layer of quartz deposited by sputtering techniques, as well as the use of supplementary coatings over the oxide or quartz, comprised of materials such as silicon nitride.

After oxidation, the oxide film 2 is then processed into a diffusion mask containing diffusion, windows, such as 3, by conventional photolithographic techniques. Normally, a photoresist material, either negative or positive type (e.g. Kodak KPR or Azoplate AZ-1350), is coated over the oxide, followed by exposure through a photomask carrying an appropriate pattern of transparent and opaque regions corresponding to the desired pattern of diffusion windows in the areas of the substrate which are to be doped with suitable diffusion of impurities. The exposure is for purposes of inducing modification of the resist properties in the exposed areas which results in areas (of the resist coating) of varying solubilities which enable removal of the resist, over the desired diffusion, in an appropriate solvent. With negative resist, a negative photomask is employed, so as to cross-link or otherwise harden the resist in the exposed areas in a pattern complementary to that of the diffusion window over which the resist is removed during development. With positive resists, the material is photodegraded on exposure in a pattern corresponding to that of the desired diffusion window over which the resist is removed in development.

After etching of the oxide in appropriate solutions (such as a buffered aq. HF solution) for removal of portions of the oxide within the open areas of resist-etch mask, the oxide is transformed into a diffusion mask 2 on complete removal of the resist-etch mask. The substrate 1 can then be subjected to conventional diffusion operations by exposure to suitable n-type determining impurities to form a diffused region 4, in substrate portions defined within the openings 3 of the oxide mask 2, with the imperforate portions of the mask serving as a barrier against diffusion in other portions of substrate 1.

For purposes of measuring the sheet resistance of the diffused region, the entire functional surface of the substrate is coated, as by evaporation techniques, with a layer 5 of a transitional metal selected from Group VIII of the Periodic Table. Each of these metals is reactive with silicon, to form a corresponding metal silicide, of which group platinum is preferred, in view of the convenience of reaction and since it provides a silicide with a convenient sheet resistance of the order of 1 ohm per square.

After metallization, the structure is then sintered by heating to elevated temperature for reaction of the transition metal with silicon to form the silicide region 6 coextending with the upper portions of diffused region 4. Where platinum is employed, sintering temperature of about 550° C for 30 minutes are sufficient to form a platinum silicide region or stratum of about 80 millimicrons, having a sheet resistance of 1 ohm per square. It may be noted that these transitional metals do not react with silicon dioxide, quartz and other coatings such as silicon nitride, which enables the removal of the metal by etching.

After sintering, the excess metal over the silicide and the diffusion mask 2 is removed by dip-etching in an appropriate solution such as aqua regia which does not attack the silicide at the same fast rate.

After removal of excess metal, the resultant silicide can be probed, by contacts 7, at spaced points to measure the resistance of the silicide layer 6 with conversion to the parallel resistance of the diffused region 4 in accordance with the following consideration.

The end-to-end resistance measurement of the parallel resistors at spaced points over the silicide region will specify the absence or presence of any defect causing mechanisms that prevent the formation of diffusion and hence the silicide in the specified diffusion geometry. The measure of resistance between neighboring parallel resistors will specify the absence or presence of any defect causing mechanisms that cause the formation of silicide and the diffusion below in undesired regions which are otherwise expected to be the diffusion mask material. The said parallel resistor formations aid the measurements by bringing the resistance into measurable range.

This embodiment can be illustrated for a silicon substrate having an n-type diffused region 4 doped with to a surface concentration of about $10^{20} cm^{-3}$, 12.5 microns long, 2 to 16 microns wide and 0.5 microns deep. The doped region was coated with a 0.05 micron layer of platinum, which on sintering at 550° C for 30 minutes formed an 0.08 micron deep layer of platinum silicide coextensive with the top portion of the doped region. Probing at longitudinal ends of the silicide (e.g. 12.5 mm spacing) provided a resistance of 3000 ohms, which translates to a resistance of 24–30K ohms for the doped region, which would have caused measurement difficulties in the absence of the silicide.

Figure 2:
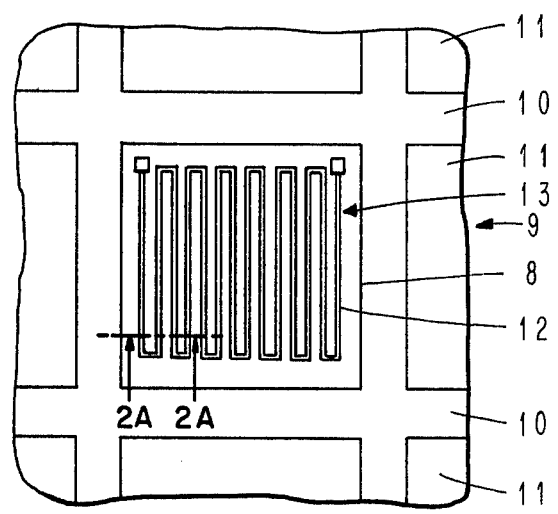
FIG. 2 is a schematic planar view for purposes of illustrating a test site, in a semiconductor wafer, embodying the invention herein.

FIG. 2 illustrates the application of the invention to the monitoring of photolithographic and diffusion operations. As shown, test diffusion patterns 13 are formed in a plurality of closely packed coextending runs 32 in a test site occupying one or more 30 by 60 mil chip areas 8 of a silicon wafer 9, with it to be recognized that other test sites can be employed, such as the kerf areas 10 when wafer real estate cannot be sacrificed.

The diffusion test regions will normally be processed concurrently with the photolithographic and diffusion operations employed in the fabrication of integrated circuits in other chip sites 11 of wafer 9. Where the integrated circuit fabrication requires multilevel diffusions, a corresponding number of test sites, in accordance with this invention, can be concurrently fabricated for monitoring each level of photolithographic and diffusion operations.

Figure 2A:
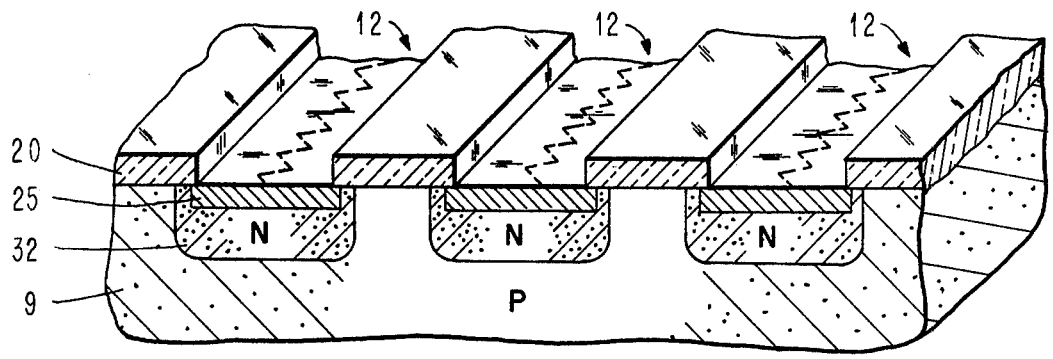
FIG. 2A is a schematic drawing in perspective of an enlarged portion of FIG. 2 for purposes of illustrating a design area of a diffused region embodying the invention.
Figure 2A:
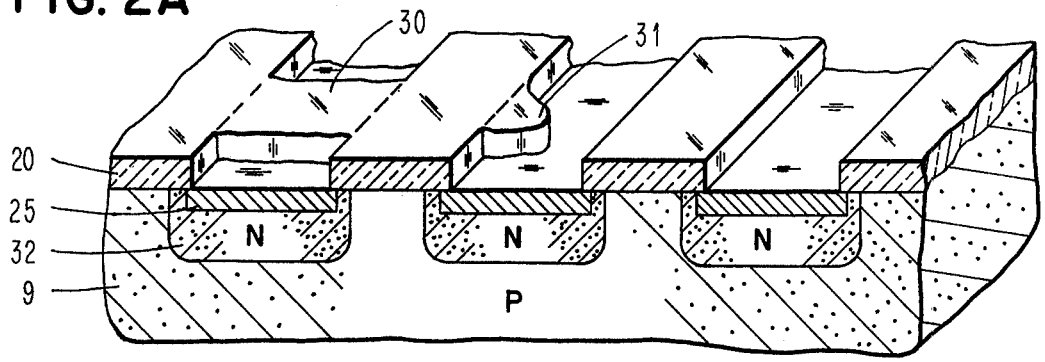
Figure 2A:
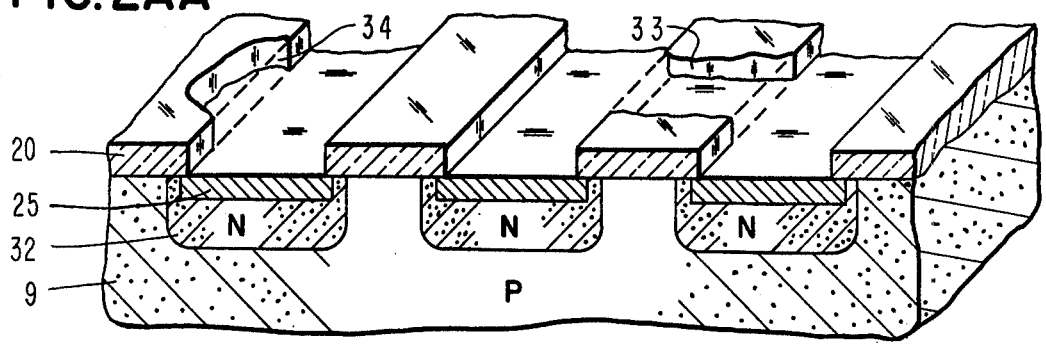

As indicated, the diffusion test pattern 13 can comprise a plurality of individual coextending test runs 32, closely spaced in the chip site 8, with each run 12 probed as required, or as shown, the coextending test runs 12 can comprise coextending legs of a serpentine pattern. As illustrated in FIG. 2A, the diffusion widths of test runs 32 (of the serpentine pattern 13) may be of the order of 2 to 16 microns, on a spacing of about 3 to 12 microns between the runs 32 with the unfolded length of the diffusion runs 32 (of a serpentine pattern 13) being of the order of 750 mils or 3000 resistance squares. Typically, the length of the test runs at the time of fabrication may be about 1000 to about 5000 squares, and are limited only by known technologies.

In accordance with conventional fabrication techniques, wafer 9 will conveniently comprise a p-type substrate overcoated with a layer 20 of a masking material such as silicon dioxide formed by oxidation of the silicon wafer or of quartz deposited by sputtering techniques. Such masking layer is then covered with a photoresist material and exposed through a pattern containing photomask to modify the resist for removal thereof over the diffusion areas. Normally, the photomask will include provision for the inclusion of one or more exposure patterns corresponding to the required serpentine test pattern 13 for chip test site 8. After development of the exposed resist, the diffusion mask 20 (e.g. silicon dioxide) is formed by etching, followed by removal of the resist and diffusion of n-type impurities, such as arsenic, into the exposed portion of wafter 9 defined within formed openings of diffusion mask 20. For the embodiment of FIGS. 2 and 2A, the doping depth is of the order of 0.5 microns with a surface concentration $C_o$ of about $10^{21} cm^{-3}$ with a sheet resistance of about 8 to 20 ohms per square for the doped regions.

The doped wafer is further processed to protect the diffused regions of the integrated circuits under fabrication, in chip sites 11, as by oxidation followed by photolithographic reopening of oxide areas over the diffused test pattern 13 of chip test site 8.

As indicated, defects (e.g. pin-holes or light transmitting areas in opaque portions) of a photomask, blemishes, dust particles on transparent areas of the photomask affect the extent of the exposure of the resist causing corresponding loss of integrity of the resist mask on development. For example, the presence of light transmitting regions in the opaque areas of a photomask will cause, on development, retention of negative resist (on the oxide film 2) in undesired sites corresponding to the defect areas of the photomask; and conversely, the removal of positive resist in portions thereof corresponding to these defect sites in the photomask. Such defects directly affect the integrity of the diffusion mask formed on etching the oxide film 20 through the open regions of the resist-etch mask. For example, as shown in FIG. 2A, light transmitting defects in the areas of a photomask result in the retention of undesired areas of negative resist which translate into corresponding defects of the oxide diffusion mask in the form of retained diffusion barriers such as 30 and 31 which can result, on diffusion, in opens in the diffusion runs 32 or pinching off of such runs to alter the electrical properties of a device. Also, such light transmitting defects in a photomask cause corresponding removal of positive resist in undesired areas, with like etching of the oxide diffusion mask 20 to result (as illustrated in FIG. 2AB) in openings or gaps 33 and/or the scoring of the required diffusion mask into recessed sections such as notch 34. Where the removed portions of the diffusion mask, such as gap 33, span designed diffused regions 32, these regions become shorted resulting in an inoperative device, and similarly notches 34 in the diffusion mask result in lateral extensions in the designed diffused regions 32 to alter the electrical properties of a device which can result in failure to meet design specifications.

Conversely, defects on photomasks or other contamination on such a mask or on resists can cause complemental defects in diffused regions. Failure of proper exposure of negative resists can result in gaps 33 (FIG. 2AB) or notched regions 34 in the diffusion mask with corresponding defects, as discussed above, in the designed diffused regions to cause shorts and/or modification of the electrical properties of a device. Also, failure to sufficiently expose positive resist in design areas can result in bridged areas 30 and/or protuberances 31 which can cause either opens and/or electrical modification in the designed diffused regions 32.

To monitor the integrity of the photolithographic and diffusion operations, wafer 9, with exposed test runs 12 is processed by evaporation of a 500 Å thick platinum film over the oxide layer and over the exposed diffused test runs 32, with sintering thereof at 550° C for 30 minutes to react the platinum with the exposed silicon to form a 800 Å thick platinum silicide stratum or layer 25 (with a sheet resistance 26 of about 1 ohm per square) in coextension with the diffusion test runs 32. Excess platinum is removed over the oxide layer 20 and over the silicide stratum 25 which is then ready for probing to obtain resistance measurements in accordance with this invention. Comparison of the sheet resistance of the platinum silicide stratum 25 (1 ohm per square) with that of the diffused runs 32 (10 ohms per square) provides an indication of the accuracy of the monitoring attainable in accordance with this invention, particularly in extended diffused test runs 32 of the order of 12.5 mm in length which involve a total resistance of about 30–100 kilohms, where conversely, the total resistance of the coextending silicide stratum 25 is only about 3–10 kilohms.

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. A method of testing continuity defects in a diffused region in a silicon semiconductor substrate comprising forming adjacent a surface portion of said region a silicide of transition metal, and measuring the resistance of said silicide at spaced points thereon.

2. The method of claim 1 where said metal is platinum.

3. The method of claim 1 wherein said surface portion is coextensive with a diffused region of said substrate.

4. The method of claim 3 where said metal is platinum.

5. The method of claim 1 wherein said diffused region comprises a test site in a semiconductor wafer.

6. The method of claim 5 where said metal is platinum.

7. The method of claim 5 wherein said diffused region has an extension of about 10 mm to about 20 mm in length with a width of about 2 to about 12 microns.

8. The method of claim 8 where said metal is platinum.

9. The method of claim 7 wherein said diffused region is contained within an area of about 20–30 by about 50–80 mils in said test site.

10. The method of claim 9 where said metal is platinum.

11. In the fabrication of integrated circuits, a method of monitoring photolithographic and diffusion operations, with said method comprising forming a diffused region in a test site of a silicon wafer concurrently with said operations, coating said region with a transition metal selected from Group VIII of the Periodic Table, heating said wafer to react said metal with the silicon of said wafer into a corresponding silicide, and measuring the resistance of said silicide at spaced points thereon.

12. The method of claim 11 where said metal is platinum.

13. The method of claim 11 wherein said diffused region comprises a test site in a semiconductor wafer.

14. The method of claim 13 where said metal is platinum.

15. The method of claim 11 wherein said diffused region has an extension of about 10 to about 20 mm in length with a width of about 2 to about 15 microns.

16. The method of claim 15 where said metal is platinum.

17. The method of claim 11 wherein said diffused region is contained within an area of about 30 by about 60 mils in said test site.

18. The method of claim 17 where said metal is platinum.

* * * * *